United States Patent
Bibeault et al.

(10) Patent No.: US 6,775,879 B2
(45) Date of Patent: Aug. 17, 2004

(54) NEEDLE CLEANING SYSTEM

(75) Inventors: Steven P. Bibeault, Methuen, MA (US); Kenneth C. Crouch, North Andover, MA (US)

(73) Assignee: Speedline Technologies, Inc., Franklin, MA (US)

( * ) Notice: Subject to any disclaimer, the term of this patent is extended or adjusted under 35 U.S.C. 154(b) by 94 days.

(21) Appl. No.: 09/974,022

(22) Filed: Oct. 10, 2001

(65) Prior Publication Data

US 2003/0066546 A1 Apr. 10, 2003

(51) Int. Cl.[7] .................................................. A47L 5/38
(52) U.S. Cl. ...................................... 15/306.1; 15/301
(58) Field of Search ............................... 15/301, 306.1; 118/302; 222/148

(56) References Cited

U.S. PATENT DOCUMENTS

| | | | |
|---|---|---|---|
| 5,525,515 A | * | 6/1996 | Blattner ....................... 222/148 |
| 5,985,029 A | | 11/1999 | Purcell |
| 6,082,289 A | * | 7/2000 | Cavallaro .................... 118/300 |
| 6,085,943 A | | 7/2000 | Cavallaro et al. |
| 6,093,251 A | | 7/2000 | Carr et al. |
| 6,544,336 B1 | * | 4/2003 | Lopes ......................... 118/302 |

* cited by examiner

Primary Examiner—Theresa T. Snider
(74) Attorney, Agent, or Firm—Lowrie, Lando & Anastasi, LLP

(57) ABSTRACT

A needle cleaning system, for use with a liquid dispensing system that dispenses a quantity of material through a dispensing needle or transfer pin, includes a vacuuming device coupled with a residual material collection device, wherein the collection device includes at least one appropriately shaped orifice for receiving an end of the dispensing needle or pin. The liquid dispensing system further includes a control system for periodically positioning the dispensing needle or pin relative the orifice in the collection device. The vacuuming device creates an airflow, which passes around the exterior of the needle or pin and into the collection device, thereby removing residual material from the exterior of the dispensing needle or pin without contact.

19 Claims, 9 Drawing Sheets

NEEDLE CLEANING SYSTEM

FIELD OF THE INVENTION

The present invention is directed generally to liquid dispensing systems having controllably movable cartridges and more specifically to liquid dispensing systems that utilize liquid dispensing needles or transfer pins and a system and method for the self-cleaning thereof.

BACKGROUND OF THE INVENTION

Several types of prior art dispensing systems are used for dispensing metered amounts of liquid or paste for a variety of applications. One such application is in the assembly of printed circuit boards and integrated circuit chips. Dispensing systems are used in this application for the process of encapsulating the integrated circuits with an encapsulate material and in the process of under filling flip integrated circuit chips with an encapsulant. Prior art dispensing systems are also used for dispensing dots or balls of liquid epoxy or solder onto circuit boards and integrated circuits. The liquid epoxy and solder is primarily used to connect components within an integrated circuit.

In a typical dispensing system, a pump and dispenser assembly is mounted to a moving assembly, such as a gantry, for moving the pump and dispenser assembly along three mutually orthogonal axes (x, y, z), by servomotors or other similar devices that are controlled by a computer system or controller. To dispense a volume of liquid on a circuit board or some other substrate at a desired location, the pump and dispenser assembly, which normally includes a nozzle coupled with a dispensing needle, is moved along the horizontal x and y axes until it is located over the desired location. The pump and dispenser assembly is then lowered along the vertical z-axis until the dispensing needle is at an appropriate height over the substrate, where it dispenses a metered volume of liquid through the needle. The pump and dispenser assembly is then raised along the z-axis, moved along the x and y axes to a next desired location and then lowered along the vertical z-axis to dispense a metered volume of liquid at the next location.

In dispensing applications such as those described above, the accuracy of the volume of liquid dispensed by the system is an important feature of the system. These dispensing systems are effective in dispensing precise amounts of metered material onto a substrate, however, over time an amount of residual or other material tends to build up on the exterior surface of the dispensing needle or pin. The build up of excess material leads to unwanted material drops, material splatter and or line/dot width variation.

It is therefore desirable to have a dispensing system that is capable of periodically cleaning residual material from the exterior surface of the dispensing needle or transfer pin.

SUMMARY OF THE INVENTION

In one aspect, the present invention is directed to a needle cleaning system for removing an amount of residual material from a liquid dispensing needle or pin. The system includes a container assembly having at least one orifice, a vacuum source operatively connected to the container assembly wherein the vacuum source creates an airflow through the at least one orifice into the container assembly and a control system that positions the liquid dispensing needle or pin relative to the at least one orifice in the container assembly wherein the residual material is removed from the dispensing needle or pin by the airflow.

The system may be constructed and arranged such that the residual material is removed from the liquid dispensing needle or pin without contact occurring between the dispensing needle or pin and the container assembly. The system may include a disposable cup for collecting an amount of removed residual material. The system may include a tube for directing the airflow towards the bottom of the disposable cup. The container assembly may include a plurality of various diameter orifices to accommodate a variety of various gauge dispensing needles or pins. The vacuum source may be coupled with one or more of the plurality of different diameter orifices whereby an airflow is created through the one or more of the plurality of different diameter orifices into the container assembly.

Another aspect of the invention is directed to a needle cleaning system for removing an amount of residual material from a liquid dispensing needle or pin where the system includes a container assembly having an iris-type shutter having a variable diameter opening, a vacuum source operatively connected to the iris-type shutter wherein the vacuum source creates an airflow through the variable diameter opening and into the container assembly and a control system that positions the liquid dispensing needle or pin relative to the iris-type shutter such that the airflow through the variable diameter opening causes the removal of the residual material from the dispensing needle or pin.

The system may be constructed and arranged such that the diameter of the variable diameter opening of the iris-type shutter may be increased or decreased to accommodate a variety of different gauge dispensing needles or pins. The control system may be constructed and arranged to operatively control the diameter of the variable diameter opening of the iris-type shutter. The container assembly may further include a disposable cup for collecting an amount of removed residual material.

Another aspect of the invention is directed to a self-cleaning liquid dispensing system. The system includes means for receiving a liquid from a liquid source, means for dispensing the liquid through a needle or pin onto a medium and means for removing an amount of residual material from an exterior portion of the needle or pin without contacting the needle or pin.

The system may be constructed and arranged such that the means for removing residual material includes a needle cleaning system that includes a container assembly having at least one orifice, a vacuum source operatively connected to the container assembly wherein the vacuum source creates an airflow through at least one orifice into the container assembly and means for operatively positioning the liquid dispensing needle or pin relative to the at least one orifice wherein the residual material is removed from the dispensing needle or pin without contact between the dispensing needle or pin and the orifice. The system may be constructed and arranged such that the means for operatively positioning the liquid dispensing needle or pin relative to the orifice includes a computer control system.

Another aspect of the invention is directed to a self-cleaning liquid dispensing system. The system includes at least one dispensing needle or pin, a needle cleaning system that includes at least one vacuum source for operatively removing residual material from the at least one dispensing needle or pin and means for operatively positioning one or more dispensing needles or pins relative to a vacuum source. The system may be constructed and arranged such that the needle cleaning system may include at least one container assembly. The container assembly may be constructed and arranged to include at least one orifice for receiving an end of a dispensing needle or pin. The container assembly may be constructed and arranged to include a plurality of various diameter orifices. The container assembly may be constructed and arranged to include at least one adjustable diameter orifice. The system may be constructed and arranged to include at least one vacuum source that may be coupled with the container assembly such that the vacuum source causes a stream of air to flow through an orifice and into the container assembly.

Another aspect of the invention is directed to a method for cleaning residual material from a dispensing needle or pin in a liquid dispensing system. The method includes steps of supplying at least one container assembly having at least one orifice, positioning the needle or pin relative to the at least one orifice and supplying a vacuum source for creating an airflow through the orifice and into the container assembly wherein the airflow causes residual material to be pulled from the dispensing needle or pin. The method may further include the step of removing the residual material from the dispensing needle or pin without having contact between the dispensing needle or pin and the orifice.

BRIEF DESCRIPTION OF THE DRAWINGS

For a better understanding of the present invention, reference is made to the drawings, which are incorporated herein by reference, and in which.

DETAILED DESCRIPTION

Figure 1:
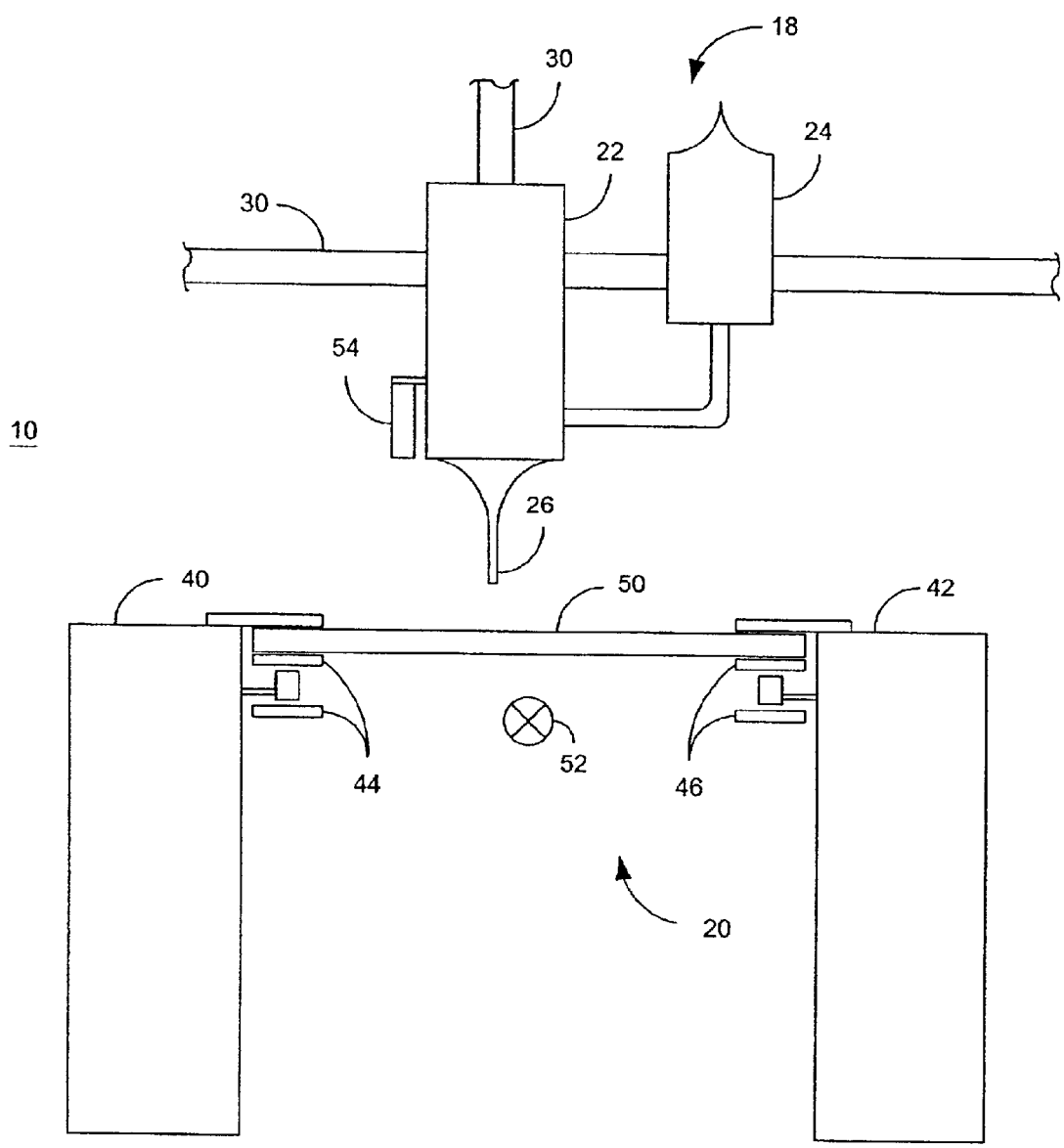
FIG. 1 is a part cross-sectional, part side view of a prior art liquid dispensing system.

For purpose of illustration, the present invention will now be described with reference to a needle cleaning system for use with a controllable liquid dispensing system that uses a needle type device to dispense viscous materials onto a substrate, such as a printed circuit board. One skilled in the art will appreciate, however, that embodiments of the present invention are not limited to such dispensing systems, and may be used in other applications requiring dispensing of a controlled amount of material from a container through a needle, a transfer pin or other similar device, Referring to FIG. 1, a prior art controllable liquid dispensing system 10, which includes a liquid pump and dispenser assembly 18 and a conveyor assembly 20 is shown. Liquid pump and dispenser assembly 18 can be one of a number of known systems, such as one of the different models of liquid dispenser systems sold by Speedline Technologies, Inc., Haverhill, Mass., under the trademark CAMALOT™ In the present example, the pump and dispenser assembly 18 includes a displacement pump 22 that receives liquid under pressure from a syringe 24, and dispenses the liquid through a dispensing needle 26. Displacement pump 22 is shown mounted to lead screws 30 for computer controlled movement along mutually orthogonal axes (x, y, z).

The conveyor assembly 20 can be any one of a number of different positioning systems for transporting and aligning a workpiece with respect to the liquid pump and dispenser assembly 18. In the present example, the conveyor assembly 20 has a pair of elongated parallel rails 40, 42 and a pair of elongated conveyors 44, 46 that extend along and next to the rails for supporting and transporting a workpiece 50, such as a circuit board, along a direction of travel 52. Motors (not shown) are mounted to the rails 40, 42 for driving the conveyors 44, 46.

As the workpiece 50 is transported into the liquid dispensing system 10, a detector, such as a vision inspection system (not shown), detects when the workpiece 50 is in proper position for processing. With the workpiece 50 properly aligned, the liquid pump and dispenser assembly 18 controllably dispenses material onto the workpiece 50 for one of a number of different purposes as noted above. Additional conveyors or positioning systems (not shown) are typically employed for transporting the workpiece 50 to and from the conveyor assembly 20 during pre-processing and post-processing stages.

For most applications, it is desirable that the dispenser assembly 18 be a precise distance above a substrate. For these applications, a height sensing device, such as a touch probe, can be used to measure the distance of the from the tip of dispensing needle 26 to the substrate to aid in proper positioning of the dispensing unit prior to dispensing. In the present example, a height-sensing device 54 is shown mounted to the displacement pump 22. The height-sensing device 54 is responsible for determining the height of the dispensing needle 26 above the workpiece 50 and may operate as a mechanical touch probe or other similar device such as a laser sensor (not shown). One example of a height sensing device is described in U.S. Pat. No. 6,093,251, which is assigned to Speedline Technologies, Inc., Franklin, Mass., and which is incorporated herein by reference, although other height sensing devices are contemplated.

Figure 2:
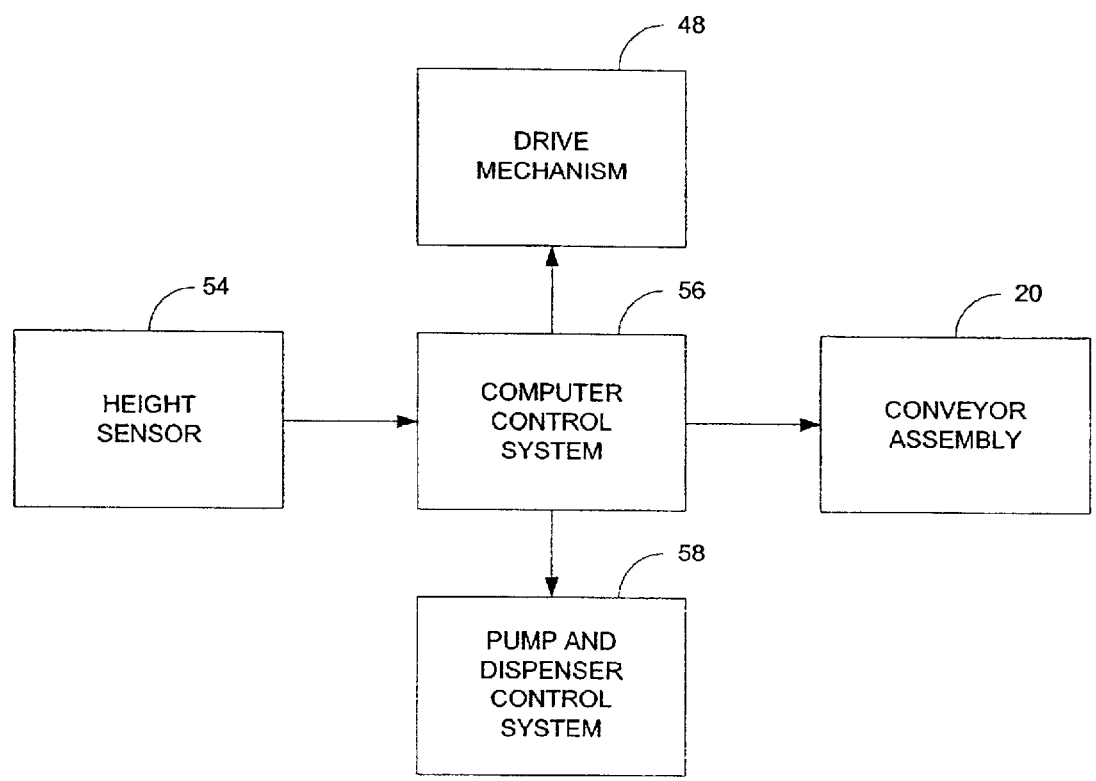
FIG. 2 is a block diagram illustrating a control system of the prior art liquid dispensing system of FIG. 1.
Figure 3:
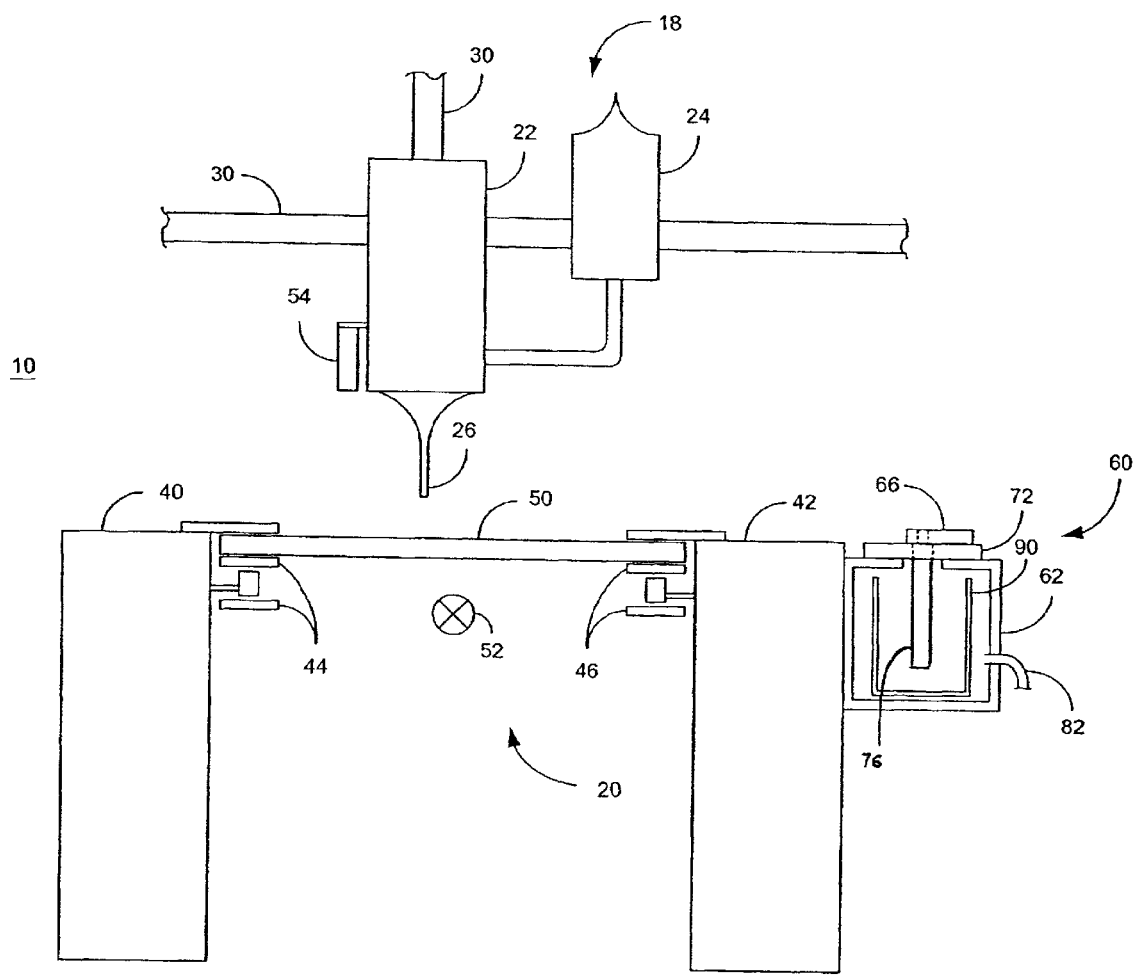
FIG. 3 is a part cross-sectional, part side view of a liquid dispensing system incorporating a needle cleaning system according to a first embodiment of the invention.
Figure 4:
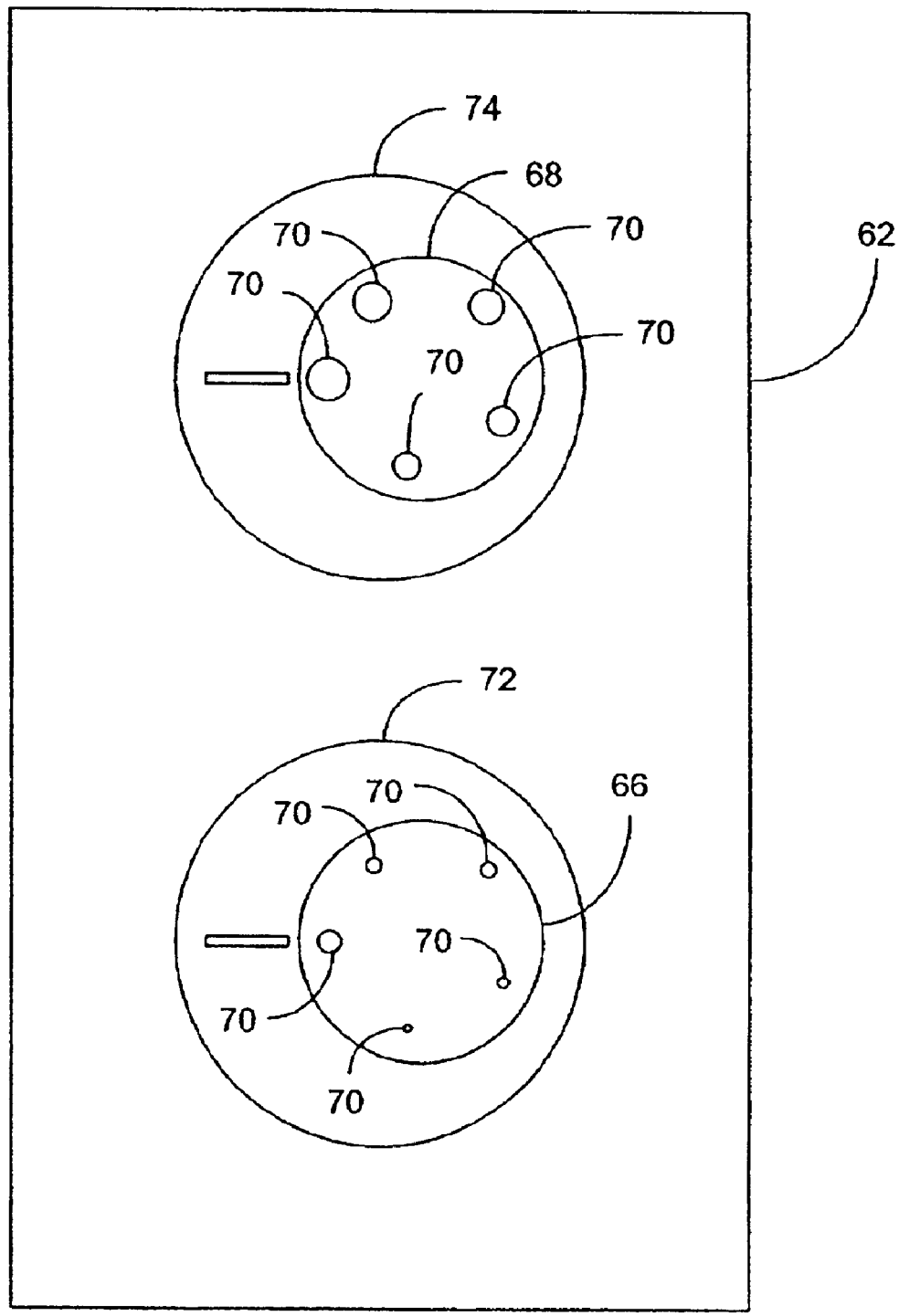
FIG. 4 is a top view of the needle cleaning system of FIG. 3.
Figure 5:
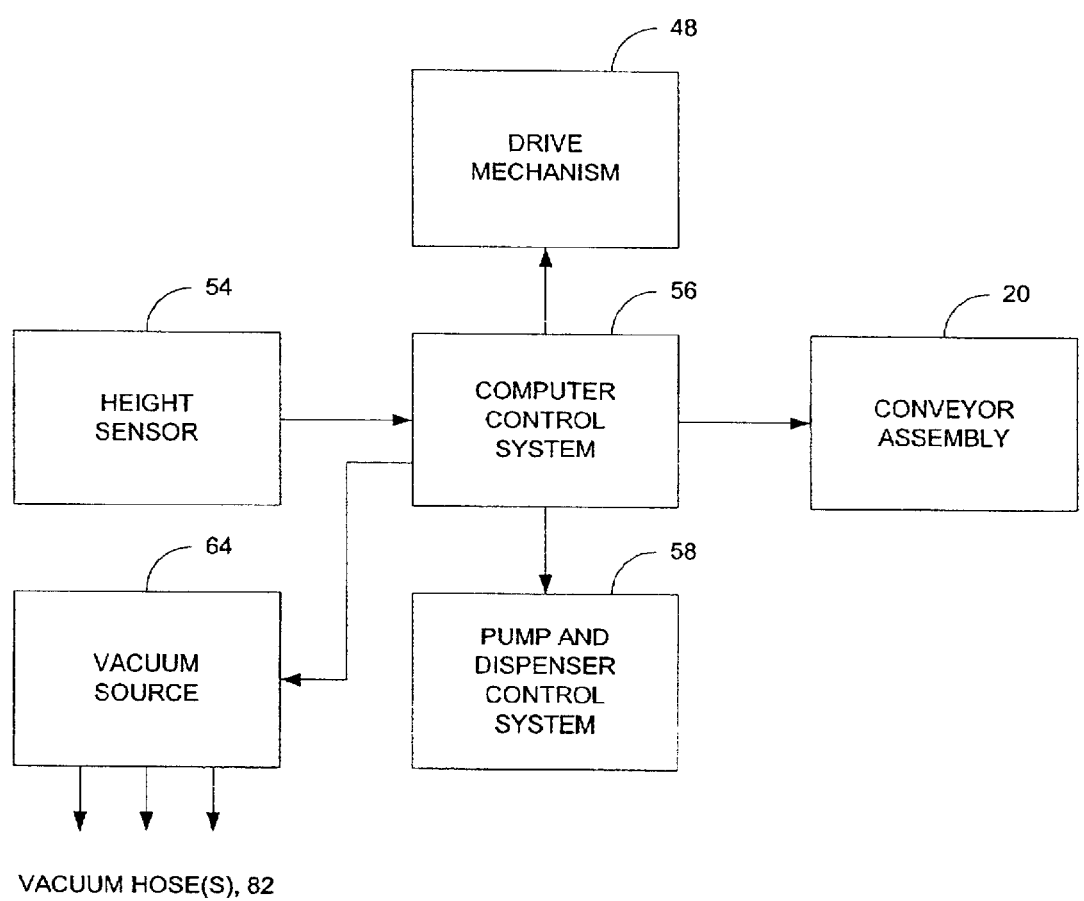
FIG. 5 is a block diagram illustrating a control system of the liquid dispensing system of FIGS. 3 and 4.

Referring now to FIG. 2, a computer control system 56 for controlling different functions of the liquid dispensing system 10 of FIG. 1 is shown. The computer control system 56 is typically configured such that when a new type of workpiece 50 is provided to the liquid dispensing system 10 (e.g., a new type of printed circuit board), the locations, sizes and amounts of material that need to be dispensed by the liquid dispensing system 10 can be adjusted. The computer control system 56 is operatively connected to a pump and dispenser control system 58, which is coupled to the liquid pump and dispenser assembly 18. The pump and dispenser control system 58 is a standard control system as is known in the art and selectively determines the volume of material to be dispensed by liquid pump and dispenser assembly 18 onto workpiece 50.

The computer control system 56 is shown operatively connected to a drive mechanism 48, which is connected to the lead screws 30. By connecting the drive mechanism 48 to a standard power control system, such as a servomotor, the positioning of the liquid pump and dispenser assembly 18, along mutually orthogonal axes (x, y, z), can be controlled. Height information generated by the height-sensing device 54 is used by the computer control system 56 and drive mechanism 48 to accurately position the dispensing needle 26 at a desired height. The computer control system 56 may also be used to control the operation of the conveyor assembly 20.

Referring now to FIGS. 3 through 6B, a needle cleaning system 60, in accordance with certain embodiments of the present invention, is shown mechanically attached to rail 42. In alternative embodiments, the needle cleaning system 60 may be attached to other parts of liquid dispensing system 10 or it may be a freestanding unit. The needle cleaning system 60 uses an orifice connected with a vacuum supply to create a high-speed stream of air for periodically suctioning residual or other material from the dispensing needle 26 as described below.

In the present example, the needle cleaning system 60 includes a container assembly 62 for suctioning and collecting the residual material from dispensing needle 26. The needle cleaning system 60 includes a pair of rotary dials 66, 68, wherein each dial includes a plurality of cleaning orifices 70. The rotary dials 66, 68 are rotationally mounted to a pair of platforms 72, 74, which are in turn mounted to container assembly 62. The platforms 72, 74 each have an opening that will allow an airflow 84 to pass through a chosen cleaning orifice 70 through a venturi tube 76 and into the container assembly 62. The cleaning orifices 70 have a variety of different diameters, which allows the needle cleaning system 60 to accommodate different gauge dispensing needles 26. A total of ten orifices 70 are shown, however, additional or fewer orifices may be employed as required. Prior to operation, an appropriate cleaning orifice 70 is chosen, whose dimensions correspond to the dimensions of the dispensing needle 26.

The container assembly 62 is operatively connected to a vacuum source 64 by a vacuum hose 82. When the vacuum source 64 is initiated, it causes the airflow 84 to stream into the container assembly 62 through an orifice 70. A set of cleaning parameters for the dispensing needle 26, such as needle gauge, needle length and frequency of cleaning can be input into computer control system 56. The cleaning parameters may be stored on magnetic media either internal or external to the computer control system 56 and loaded into the computer control system 56 using an appropriate magnetic reading apparatus as needed. Alternatively, an operator of the liquid dispensing system 10 may manually enter the cleaning parameters into the computer control system 56. The cleaning parameters may also include the coordinates of the cleaning orifice 70 in relation to the dispensing needle 26, the distance above the cleaning orifice 70 at which the needle 26 should be positioned at the beginning of the cleaning process, the distance into the cleaning orifice 70 that dispensing needle 26 should be inserted during cleaning, the rate at which the dispensing needle 26 should be advanced and the amount of vacuum pressure needed from vacuum source 64 for proper cleaning of the dispensing needle 26.

In the present embodiment, an appropriately dimensioned orifice 70 (i.e., an orifice whose diameter corresponds to the gauge of the dispensing needle being cleaned) may be selected or dialed by the computer control system 56 or may be manually selected by a user. In certain embodiments, different orifices may accommodate more than one gauge needle. For example, an orifice having a diameter of approximately 0.025 inches may appropriately accommodate needles having a range of outer diameters of approximately 0.014–0.009 inches. As described, only one orifice 70 is in operation at any given time, however, additional of the orifices 70 may be connected to the vacuum source 64 or to alternate vacuum sources and used concurrently.

Figure 6A:
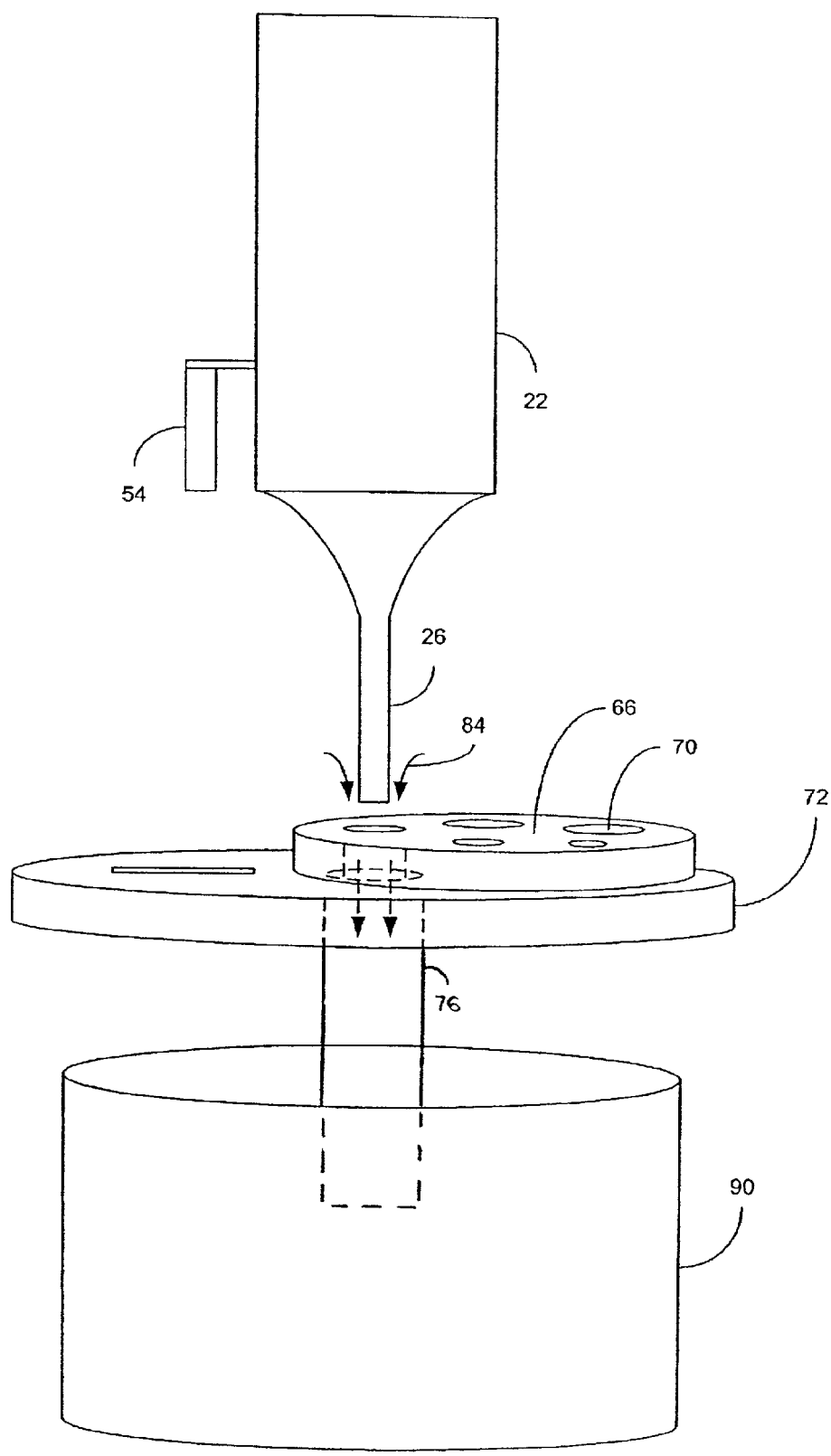
FIG. 6A illustrates a partial broken away view of the needle cleaning system of FIGS. 3 and 4.
Figure 6B:
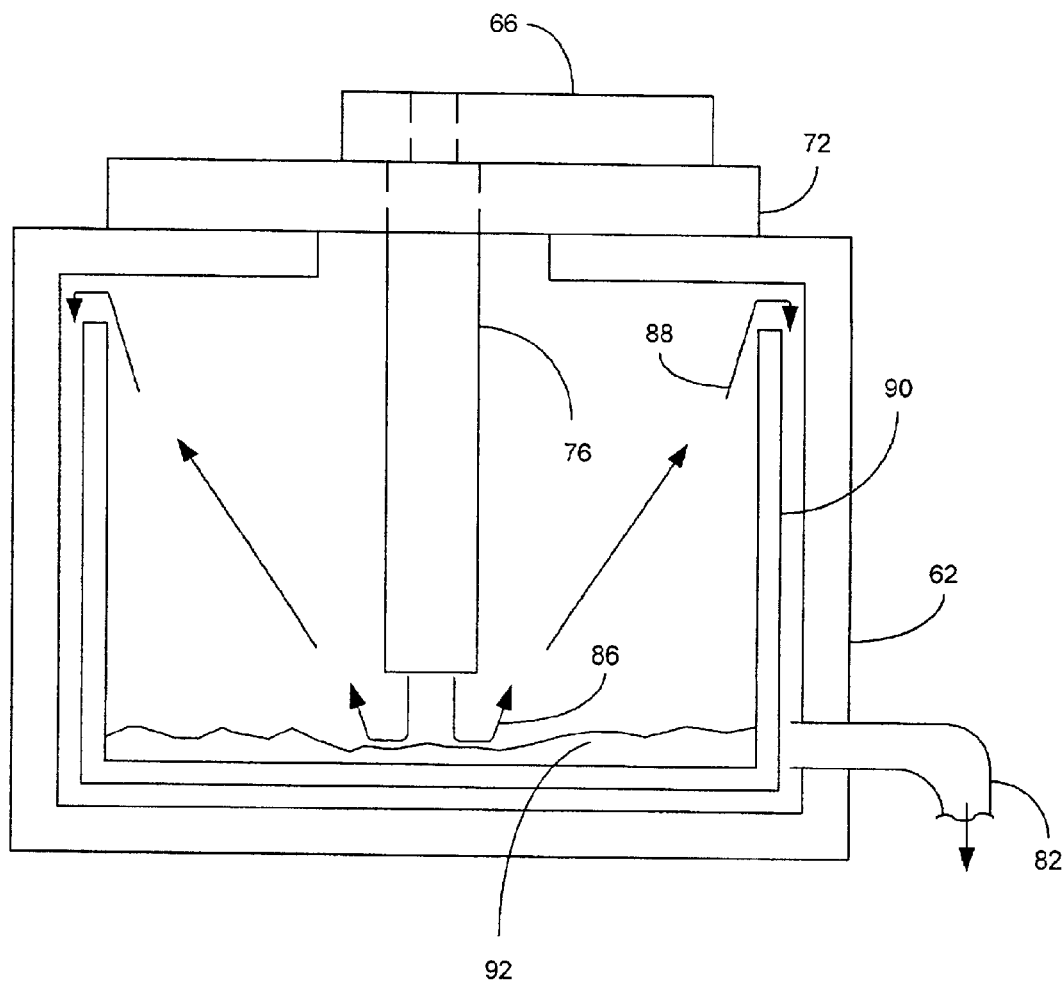
FIG. 6B illustrates an enlarged view of the needle cleaning system of FIGS. 3, 4 and 6A.

As illustrated, the computer control system 56 is operatively connected to the vacuum source 64. Once the needle 26 is properly positioned over a cleaning orifice 70 in rotary dial 66, as shown in FIG. 6, or just prior thereto, the computer control system 56 signals the vacuum source 64 to turn on. In alternative embodiments, a photocell or a group of photocells (not shown) or a proximity type sensing device may be positioned to detect the presence of a dispensing needle 26 to be cleaned. The photocells may be reflective photocells and may include LED's coupled with CCD arrays (not shown) that detect the presence of and or the distance an object (e.g., a dispensing needle 26) is to the rotary dials 66, 68. Upon detection of a dispensing needle 26, the photocell(s) will trigger the cleaning process by turning the vacuum source 64 on. After cleaning, as the dispensing needle is withdrawn from the cleaning system 60, the photocells will trigger the vacuum source 64 to turn off. In this embodiment, the photocells help reduce the amount of circuitry needed, such as timers, to operate the needle cleaning system.

In the present embodiment, when the vacuum source 64 is activated, it creates a suction force in vacuum hose 82, which causes an airflow 84 to flow past the end of the dispensing needle 26, through the selected orifice 70, through the venturi tube 76 and into the container assembly 62. After the airflow 84 exits the venturi tube 76 it experiences a first airflow reversal 86 at the bottom of container 90 and a second airflow reversal 88 again at the top of container 90. The airflow reversals 86, 88 cause sufficient flow disruption so as to separate the liquid residue 92 from the airflow. The removed liquid residue 92 contacts the container bottom with sufficient momentum as to cause it to adhere to the bottom of the container.

With the vacuum source 64 initiated, the computer control system 56 directs the drive mechanism 48 to lower the dispensing needle 26 into the selected orifice 70 an appropriate distance, preferably using the height information acquired from the height sensor 54. The rate of movement of dispensing needle 26 in the z-axis may be governed by the computer control system 56 and may also be calibrated with regard to the gauge of the needle and the material being dispensed so as to minimize the time required to efficiently clean the dispensing needle 26 and return it to its primary function of dispensing liquid. Alternatively, the dispensing needle may be controlled at a preset speed wherein the needle cleaning system adapts to the presence of dispensing needle.

In operation, as the dispensing needle 26 meets the airflow 84 created by the vacuum source 64, the airflow 84 will pull any residual material from the exterior surface of the dispensing needle 26. In the present embodiment, once the residual material is removed from the dispensing needle 26, it will flow along with the rapidly moving airstream through venturi tube 76 and into a disposable contain 90, as above-described.

Alternatively, the vacuum source 64 may be connected directly to a selected orifice 70, such that the residual material removed from dispensing needle 26 passes directly into the vacuum hose 82, rather than into the disposable cup 90. As described, the vacuum source 64 is controlled by the computer control system 56, however, the vacuum source 64 may be manually controlled or left continuously running during operation of the liquid dispensing system 10. Prior to the cleaning operation as described above, the computer control system 56 will preferably shut off the liquid pump and dispenser assembly 18, so that additional liquid will not be removed from within dispensing needle 26 during cleaning.

For illustration purposes, a single pump and dispenser assembly 18 is shown. In other embodiments, the needle cleaning system 60 may be employed by various other liquid dispensing systems, such as the systems described in U.S. Pat. No. 6,082,289, which is assigned to Speedline Technologies, Inc., Haverhill, Mass., and which is incorporated herein by reference. These liquid dispensing systems may employ multiple cartridges and therefore multiple dispensing needles, which may vary in size and shape. The needle cleaning system 60 may accommodate dispensing systems using multiple dispensing needles by individually or simultaneously introducing each dispensing needle to a properly dimensioned cleaning orifice 70. To accommodate these dispensing systems, multiple orifices 70 may be controllably selected by an operator or by the computer control system 56 during cleaning. In an alternative embodiment, a single cleaning system having multiple various diameter cleaning orifices, each attached to a vacuum source, may be used.

Also for illustration, a single conveyor assembly is shown, however, it is contemplated that multiple conveyors may be simultaneously employed by dispensing system 10.

Figure 7:
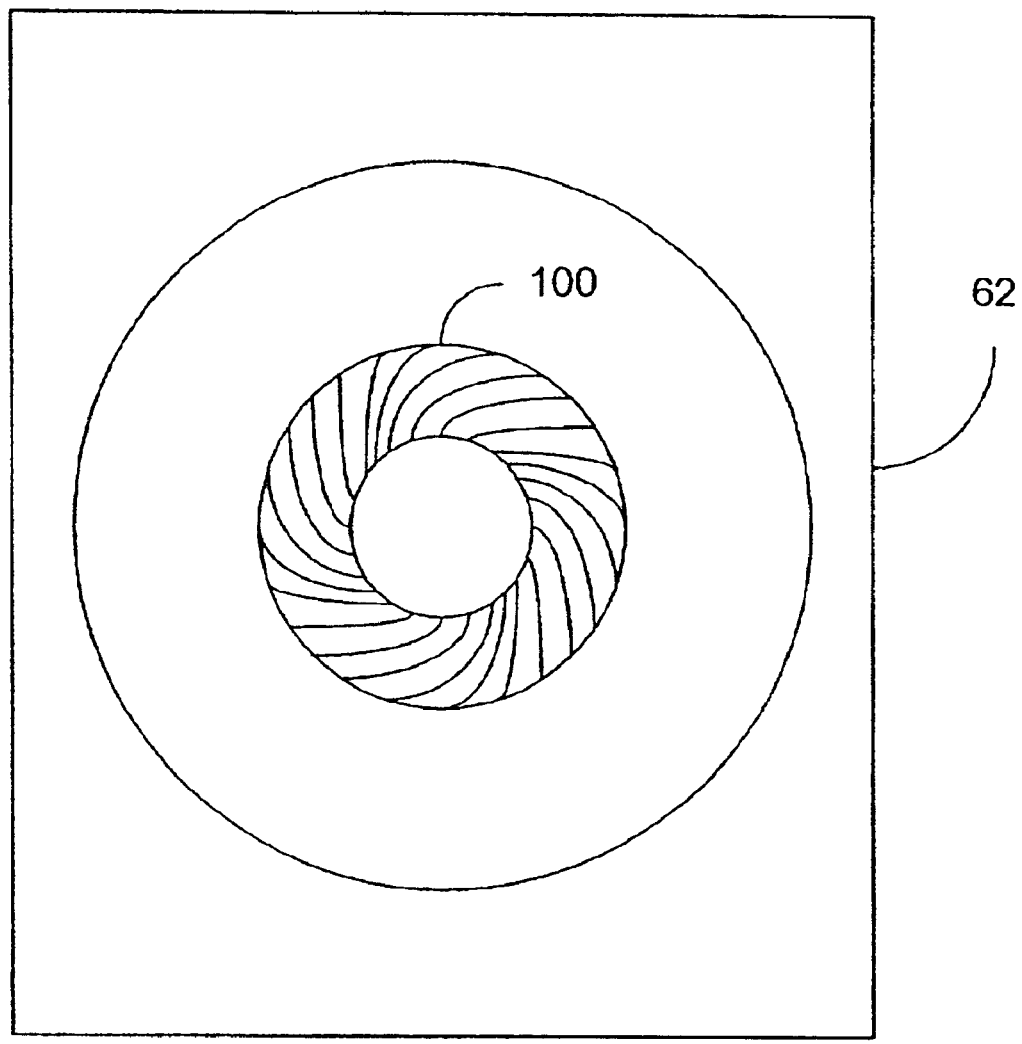
FIG. 7 is a top view of a needle cleaning system having an adjustable diameter orifice according to a second embodiment of the present invention.
Figure 8:
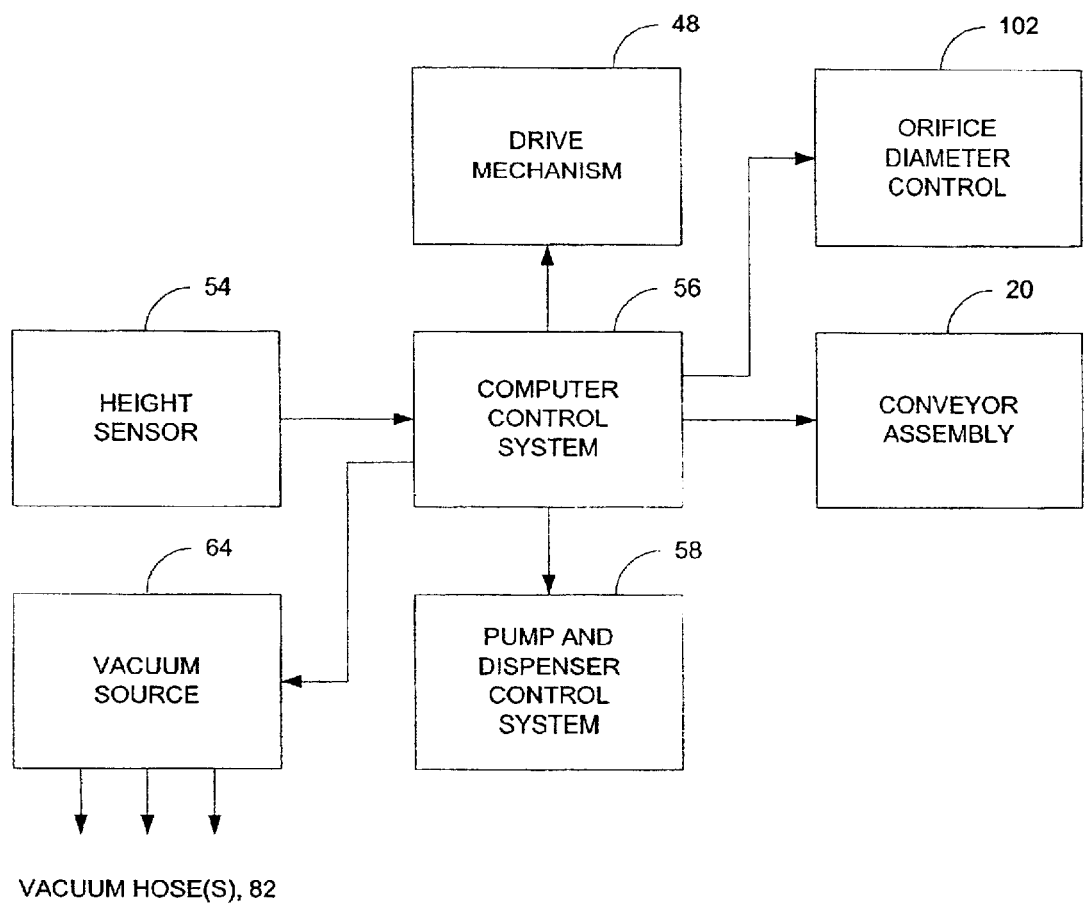
FIG. 8 is a block diagram illustrating a control system of a liquid dispensing system incorporating the needle cleaning system of FIG. 7.

Referring now to FIGS. 7 and 8, an alternative embodiment of the present invention is contemplated, wherein the needle cleaning system 10 incorporates an adjustable diameter orifice 100 for accommodating multiple or various gauge dispensing needles 26. The adjustable diameter orifice 100 is shown having an iris shutter arrangement, although other types of adjustable diameter orifices are contemplated, wherein the diameter of the orifice 100 may be controlled by computer control system 56 or may be manually adjusted by a user. This embodiment of the present invention may be programmed to accommodate all of the types of dispensing systems discussed above including dispensing systems employing single or multiple dispensing needles and single or multiple conveyor systems.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A cleaning system for removing an amount of residual material from a liquid dispensing needle or pin, the system comprising:
   a container assembly having at least one orifice;
   a vacuum source operatively connected to the container assembly wherein the vacuum source draws air to create an airflow through the at least one orifice into the container assembly; and
   a control system that positions the liquid dispensing needle or pin relative to the at least one orifice in the container assembly wherein the residual material is removed from the dispensing needle or pin by the airflow moving along the exterior surface of the liquid dispensing needle or pin as the airflow moves through the at least one orifice.

2. The cleaning system as claimed in claim 1 wherein the cleaning system is constructed and arranged such that the residual material is removed from the dispensing needle or pin without contact between the dispensing needle or pin and the container assembly.

3. The cleaning system as claimed in claim 1 wherein the container assembly further includes a disposable cup for collecting an amount of removed residual material.

4. The cleaning system as claimed in claim 3 wherein the container assembly further includes a tube for directing the airflow towards the bottom of the disposable cup.

5. The cleaning system as claimed in claim 1 wherein the container assembly includes a plurality of various diameter orifices to accommodate a variety of various gauge dispensing needles or pins.

6. The cleaning system as claimed in claim 5, wherein the vacuum source may be coupled with one or more of the plurality of different diameter orifices whereby an airflow is drawn through the one or more of the plurality of different diameter orifices into the container assembly.

7. The cleaning system as claimed in claim 5 wherein the container assembly further includes a disposable cup for collecting an amount of removed residual material.

8. A cleaning system for removing an amount of residual material from a liquid dispensing needle, the system comprising:
   a container assembly having an iris-type shutter having a variable diameter opening;
   a vacuum source operatively connected to the iris-type shutter wherein the vacuum source draws air to create an airflow through the variable diameter opening and into the container assembly; and
   a control system that positions the liquid dispensing needle or pin relative to the iris-type shutter such that the airflow through the variable diameter opening causes the removal of the residual material from the dispensing needle or pin.

9. The cleaning system as claimed in claim 8 wherein the diameter of the variable diameter opening of the iris-type shutter may be increased or decreased to accommodate a variety of different gauge dispensing needles or pins.

10. The cleaning system as claimed in claim 9 wherein the control system operatively controls the diameter of the variable diameter opening of the iris-type shutter.

11. The cleaning system as claimed in claim 10 wherein the container assembly further includes a disposable cup for collecting an amount of removed residual material.

12. A self-cleaning liquid dispensing system comprising:
   means for receiving a liquid from a liquid source;
   means for dispensing the liquid through a needle or pin onto a medium; and
   means for removing an amount of residual material from an exterior portion of the needle or pin without contacting the needle or pin by drawing air that moves proximal to the exterior surface of the needle or pin, the means for removing residual material includes a cleaning system comprising
      a container assembly having at least one orifice,
      a vacuum source operatively connected to the container assembly wherein the vacuum source draws air to create an airflow through at least one orifice into the container assembly, and
      means for operatively positioning the liquid dispensing needle relative to the at least one orifice wherein the residual material is removed from the dispensing needle or pin without contact between the dispensing needle or pin and the orifice.

13. The liquid dispensing system as claimed in claim 12 wherein the means for operatively positioning the liquid dispensing needle or pin relative to the at least one orifice includes a computer control system.

14. A self-cleaning liquid dispensing system comprising:
at least one dispensing needle or pin;
a cleaning system including at least one vacuum source for operatively removing residual material from the exterior of the at least one dispensing needle or pin by creating an airflow proximal to the exterior of the at least one dispensing needle or pin; and
means for operatively positioning the at least one dispensing needle or pin relative to the vacuum source;
wherein the cleaning system further comprises at least one container assembly.

15. The liquid dispensing system as claimed in claim 14, wherein the at least one container assembly further comprises at least one orifice for receiving an end of the at least one dispensing needle or pin.

16. The liquid dispensing system as claimed in claim 15, wherein the container assembly includes a plurality of various diameter orifices.

17. The liquid dispensing system as claimed in claim 15, wherein the container assembly includes at least one adjustable diameter orifice.

18. The liquid dispensing system as claimed in claim 15, claim 16 or claim 17, wherein the at least one vacuum source is coupled with the at least one container assembly such that the vacuum source draws air through the orifice and into the container assembly along the length of the at least one dispensing needle or pin.

19. A cleaning system for removing an amount of material from a dispensing needle, the system comprising:
a container assembly having at least one orifice;
a device to create a pressure differential between an area outside of the container assembly and an area inside the container assembly, wherein the device creates an airflow in the container assembly,
wherein the amount of material is removed from the dispensing needle by the airflow flowing along an outside surface of the dispensing needle.

* * * * *